(12) United States Patent
Tanaka

(10) Patent No.: US 11,527,596 B2
(45) Date of Patent: Dec. 13, 2022

(54) DISPLAY DEVICE

(71) Applicant: Tianma Japan, Ltd., Kawasaki (JP)

(72) Inventor: Jun Tanaka, Kawasaki (JP)

(73) Assignees: TIANMA JAPAN, LTD., Kanagawa (JP); WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 150 days.

(21) Appl. No.: 16/937,244

(22) Filed: Jul. 23, 2020

(65) Prior Publication Data

US 2021/0028262 A1     Jan. 28, 2021

(30) Foreign Application Priority Data

Jul. 24, 2019  (JP) .............................. JP2019-136128
Apr. 1, 2020   (JP) .............................. JP2020-066024

(51) Int. Cl.
*H01L 27/32* (2006.01)

(52) U.S. Cl.
CPC ........ *H01L 27/3272* (2013.01); *H01L 27/326* (2013.01); *H01L 27/3276* (2013.01)

(58) Field of Classification Search
CPC ............. H01L 27/3258; H01L 27/3272; H01L 27/326; H01L 27/3276; H01L 51/5284
See application file for complete search history.

(56) References Cited

U.S. PATENT DOCUMENTS

| | | | | |
|---|---|---|---|---|
| 2010/0065849 | A1* | 3/2010 | Lee | H01L 27/1281 257/E21.532 |
| 2011/0204369 | A1* | 8/2011 | Ha | H01L 27/3276 257/59 |
| 2011/0221661 | A1* | 9/2011 | Yoon | H01L 27/3272 345/76 |
| 2013/0270527 | A1* | 10/2013 | Kwon | H01L 29/24 254/43 |
| 2016/0141339 | A1* | 5/2016 | Prushinskiy | H01L 27/326 257/40 |
| 2016/0172633 | A1* | 6/2016 | Ahn | H01L 27/326 257/40 |
| 2016/0181333 | A1 | 6/2016 | Park et al. | |
| 2016/0254337 | A1* | 9/2016 | Choi | H01L 27/3265 257/40 |
| 2018/0181333 | A1 | 6/2018 | Tewalt | |

* cited by examiner

*Primary Examiner* — Vongsavanh Sengdara
(74) *Attorney, Agent, or Firm* — Nixon & Vanderhye

(57) ABSTRACT

A display device includes a light transmitting substrate in which pixels are arranged, the pixels having a light transmitting region that transmits external light and a light emitting region in which a light emitting element is disposed; a first light blocking layer that is disposed in the light emitting region and blocks the external light; a thin film transistor that is disposed on the first light blocking layer and controls a light emission of the light emitting element; a first insulating layer that covers an active layer of the thin film transistor; a second light blocking layer that is disposed on the first insulating layer so as to cover the thin film transistor and blocks the external light; and a first light blocking wall that is connected to the first light blocking layer and the second light blocking layer and blocks the external light.

14 Claims, 13 Drawing Sheets

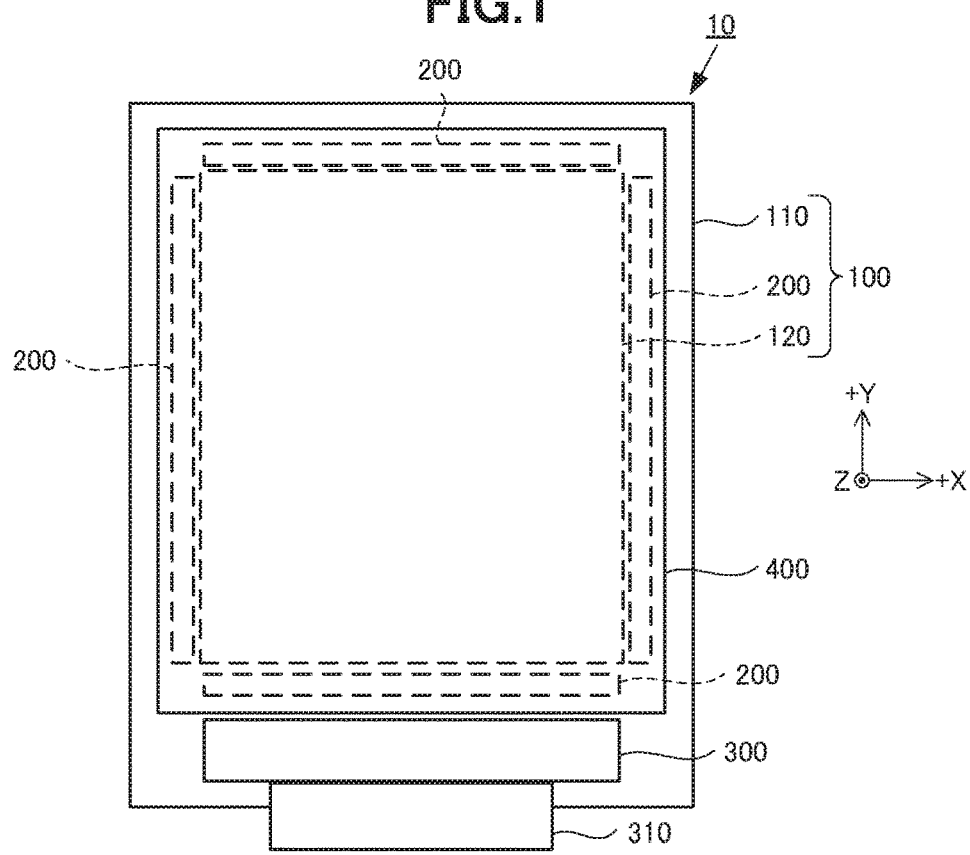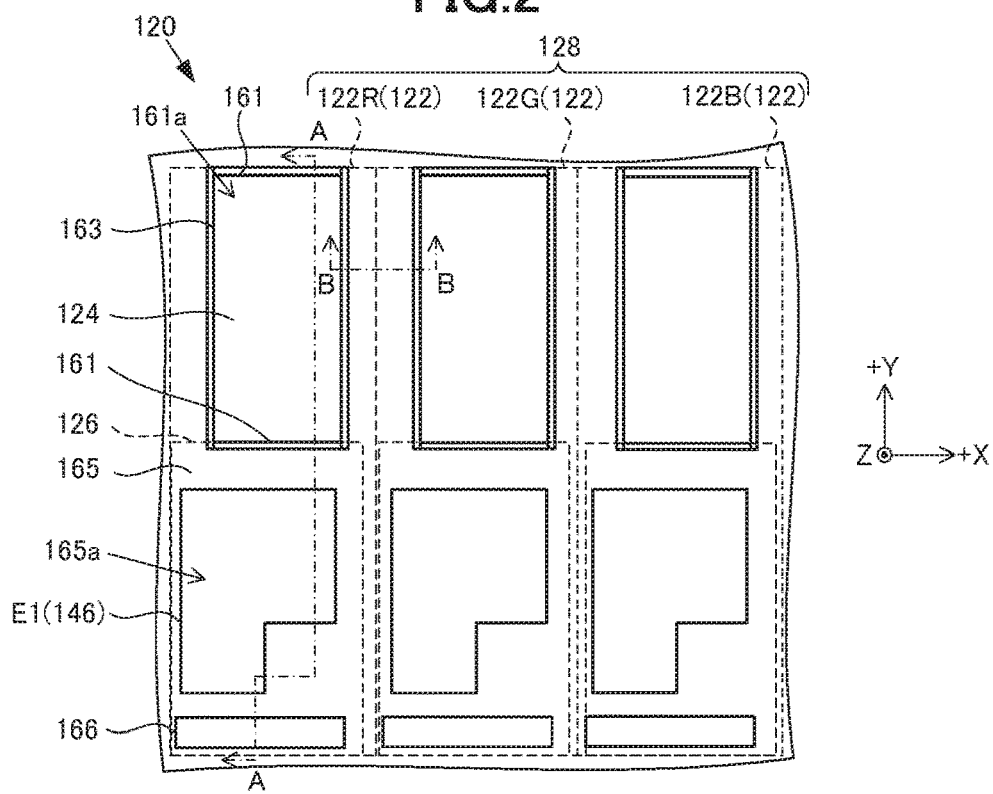

DISPLAY DEVICE

FIELD

The present disclosure relates to a light emitting display device.

BACKGROUND

Transparent organic light emitting diode (OLED) display devices that display images and through which the back of the display device can be seen are known in the art. For example, US Patent Application Publication No. 2016/0181333 discloses an OLED display device that includes a light-emitting region in which pixels are arranged, and a transparent region that transmits external light. The transparent region of this OLED display device includes an opening for transmitting external light.

The OLED display device disclosed in US Patent Application Publication No. 2016/0181333 includes an opaque second insulating layer and an opaque pixel defining layer in order to suppress the blurring of images, which is caused by the reflection of external light by metal wirings. The opaque second insulating layer and the opaque pixel defining layer block external light that is incident on the light-emitting region from the front side of the OLED display device.

The second insulating layer and the pixel defining layer disclosed in US Patent Application Publication No. 2016/0181333 cannot block external light that is incident on the light-emitting region from the back side of the OLED display device. External light that enters the light-emitting region from the back side of the OLED display device causes a shift in the threshold voltage of the thin film transistor (TFT) that drives the pixels. Furthermore, in this OLED display device, the gap between the opening and the TFT must be widened in order to prevent the external light, which has entered through the opening from the front side, from entering the TFT. When the gap between the opening and the TFT is wide, it is difficult to increase the definition of the OLED display device.

SUMMARY

A display device of the present disclosure includes:

a light transmitting substrate in which pixels are arranged, the pixels having a light transmitting region that transmits external light and a light emitting region in which a light emitting element is disposed;

a first light blocking layer that is disposed in the light emitting region and blocks the external light;

a thin film transistor that is disposed on the first light blocking layer and controls a light emission of the light emitting element;

a first insulating layer that covers an active layer of the thin film transistor;

a second light blocking layer that is disposed on the first insulating layer so as to cover the thin film transistor and blocks the external light; and a first light blocking wall that is connected to the first light blocking layer and the second light blocking layer and blocks the external light.

It is to be understood that both the foregoing general description and the following detailed description are exemplary and explanatory and are not restrictive of this disclosure.

BRIEF DESCRIPTION OF THE DRAWINGS

A more complete understanding of this application can be obtained when the following detailed description is considered in conjunction with the following drawings, in which:

FIG. 1 is a plan view illustrating a display device according to Embodiment 1;

FIG. 2 is a plan view illustrating a display region according to Embodiment 1;

DETAILED DESCRIPTION

Figure 3:
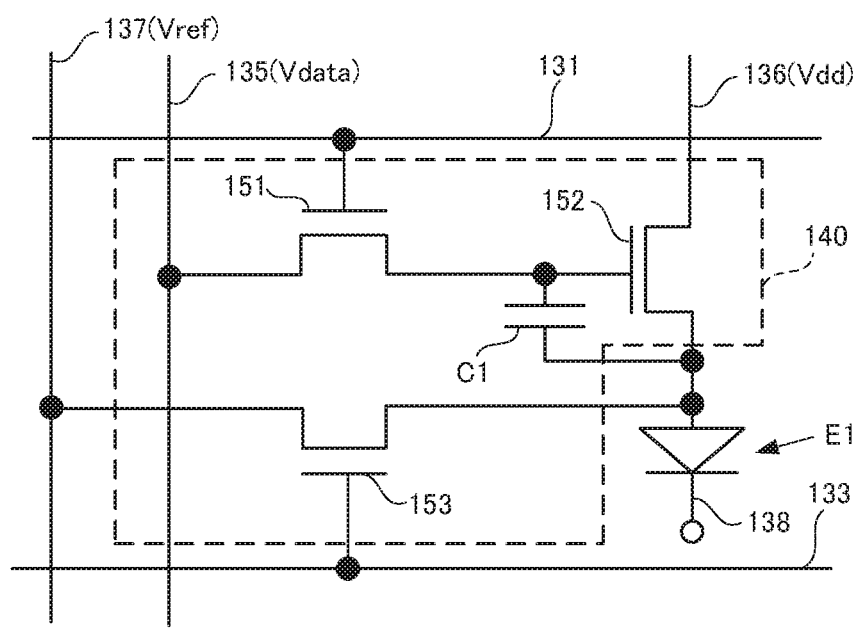
FIG. 3 is a drawing illustrating a pixel circuit according to Embodiment 1.

Hereinafter, a display device according to various embodiments is described while referencing the drawings.

Embodiment 1

A display device 10 according to the present embodiment is described while referencing FIGS. 1 to 6. In one example, the display device 10 is implemented as an organic light emitting diode (OLED) display device that is driven by a thin film transistor (TFT). The display device 10 displays images. Additionally, an observer can recognize the back of the display device 10.

Display Device

First, the overall functional configuration of the display device 10 is described. As illustrated in FIG. 1, the display device 10 includes a TFT substrate 100, a driver IC 300, and a sealing substrate 400. The TFT substrate 100 includes a light transmitting substrate 110 and a driver circuit 200. In the present description, to facilitate comprehension, in the display device 10 of FIG. 1, the lateral right direction (the right direction on paper) is referred to as the "+X direction", the up direction (the up direction on paper) is referred to as the "+Y direction", and the direction perpendicular to the +X direction and the +Y direction (the front direction on paper) is referred to as the "+Z direction."

The light transmitting substrate 110 of the TFT substrate 100 includes a display region 120. The driver circuit 200 of the TFT substrate 100 is provided at a position surrounding the display region 120 of the light transmitting substrate 110.

In one example, the light transmitting substrate 110 of the TFT substrate 100 is implemented as a glass substrate. Pixels 122R, 122B, 122G (described later) is arranged in the display region 120 of the light transmitting substrate 110. Hereinafter, the term "pixel 122" is used when referring collectively to the pixels 122R, 122B, 122G.

As illustrated in FIG. 2, the pixel 122 includes a light transmitting region 124 and a light emitting region 126. The light transmitting region 124 transmits external light. Here, the term "external light" refers to light, including sunlight and illumination light, that is incident on the display device 10 from around the display device 10. The light emitting region 126 includes a light emitting element E1, a pixel circuit 140 that controls the light emission of the light emitting element E1, and the like (described later). In the present embodiment, the light emitting element E1 is implemented as an organic light emitting diode. The light emitting element E1 of the pixel 122R emits red light, and the light emitting element E1 of the pixel 122B emits blue light. The light emitting element E1 of the pixel 122G emits green light. The pixel 122R, the pixel 122B, and the pixel 122G are arranged in the +X direction to form a single main pixel 128. The main pixel 128 is arranged in a matrix. Each of the pixel 122R, the pixel 122B, and the pixel 122G is also arranged in the ±Y direction. Detailed configurations of the display region 120 and the pixel 122 are described later. Note that, to facilitate comprehension, a cathode electrode 147 (described later) of the light emitting element E1 is omitted from FIG. 2.

As illustrated in FIG. 1, the driver circuit 200 of the TFT substrate 100 drives, via gate lines 131, 133 and supply wirings 135, 136, 137 (described later), the pixel circuit 140 that is provided in the light emitting region 126 of the pixel 122. The gate lines 131, 133 and the supply wirings 135, 136, 137 are disposed on the light transmitting substrate 110.

The driver IC 300 is provided on the light transmitting substrate 110 of the TFT substrate 100. The driver IC 300 supplies power, timing signals, and the like to the driver circuit 200. The driver IC 300 is connected to an external circuit via a flexible printed circuit (FPC) 310.

The sealing substrate 400 is a light transmitting substrate. The sealing substrate 400 is joined to the TFT substrate 100 by glass frit to seal the display region 120 of the TFT substrate 100. In one example, dry air is enclosed between the sealing substrate 400 and the TFT substrate 100.

Configuration of Pixel Circuit

Next, the pixel circuit 140 provided in the light emitting region 126 of the pixel 122 is described while referencing FIG. 3. The pixel circuit 140 controls the light emission of the light emitting element E1 provided in the light emitting region 126 of the pixel 122. As illustrated in FIG. 3, the pixel circuit 140 is connected to the driver circuit 200 via the gate lines 131, 133 and the supply wirings 135, 136, 137. In the present description, the term "supply wiring" refers to a wiring or interconnect that connects to the source or the drain of a thin film transistor. In the present embodiment, the supply wiring 135 functions as a data line (Vdata), and the supply wiring 136 functions as a power line (Vdd). The supply wiring 137 functions as a reference voltage supply line (Vref).

The pixel circuit 140 includes a switching TFT 151, a driving TFT 152, a reset TFT 153, and a hold capacitor C1. The switching TFT 151, the driving TFT 152, and the reset TFT 153 function as thin film transistors that control the light emission of the light emitting element E1. Hereinafter, the term "pixel TFT 150" is used when referring collectively to the switching TFT 151, the driving TFT 152, and the reset TFT 153.

The switching TFT 151 is a transistor that selects the pixel 122. The gate of the switching TFT 151 is connected to the gate line 131, which functions as a scan line. The source of the switching TFT 151 is connected to the supply wiring (Vdata) 135. The drain of the switching TFT 151 is connected to the gate of the driving TFT 152.

The driving TFT 152 is a transistor that drives the light emitting element E1. The gate of the driving TFT 152 is connected to the drain of the switching TFT 151. The source of the driving TFT 152 is connected to the supply wiring (Vdd) 136. The drain of the driving TFT 152 is connected to the anode of the light emitting element E1. Note that the cathode of the light emitting element E1 is connected to a cathode line 138.

The hold capacitor C1 is formed between the anode of the light emitting element E1 and the gate of the driving TFT 152.

In one example, the reset TFT 153 is used to apply, to the anode of the light emitting element E1, voltage less than or equal to a threshold voltage of the light emitting element E1. By applying, to the anode of the light emitting element E1, the voltage that is less than or equal to the threshold voltage of the light emitting element E1, crosstalk, which is caused by leak current of the light emitting element E1, can be suppressed. The gate of the reset TFT 153 is connected to the gate line 133. The source of the reset TFT 153 is connected to the supply wiring (Vref) 137. The drain of the reset TFT 153 is connected to the anode of the light emitting element E1.

Next, the operations of the pixel circuit 140 are described. First, the driver circuit 200 outputs a selection signal to the gate line 131, thereby putting the switching TFT 151 in an open state. When the switching TFT 151 assumes the open state, the data voltage supplied via the supply wiring (Vdata) 135 is held by the hold capacitor C1. The open/close state of the driving TFT 152 changes due to the voltage held by the hold capacitor C1 and, as a result, current corresponding to the gradation of the light emitting element E1 is supplied to the light emitting element E1 from the supply wiring (Vdd) 136. Then, the light emitting element E1 provided in the pixel 122 emits light, and a color image is displayed in the display region 120. The reset TFT 153 is in an open state before the light emitting period in which the light emitting element E1 emits light. When the reset TFT 153 is in the open state, voltage less than or equal to the threshold voltage of the light emitting element E1 is applied, from the supply wiring (Vref) 137, to an anode electrode 145 of the light emitting element E1. As a result, the potential of the anode of the light emitting element E1 is reset.

Display Region and Pixel

Figure 4:
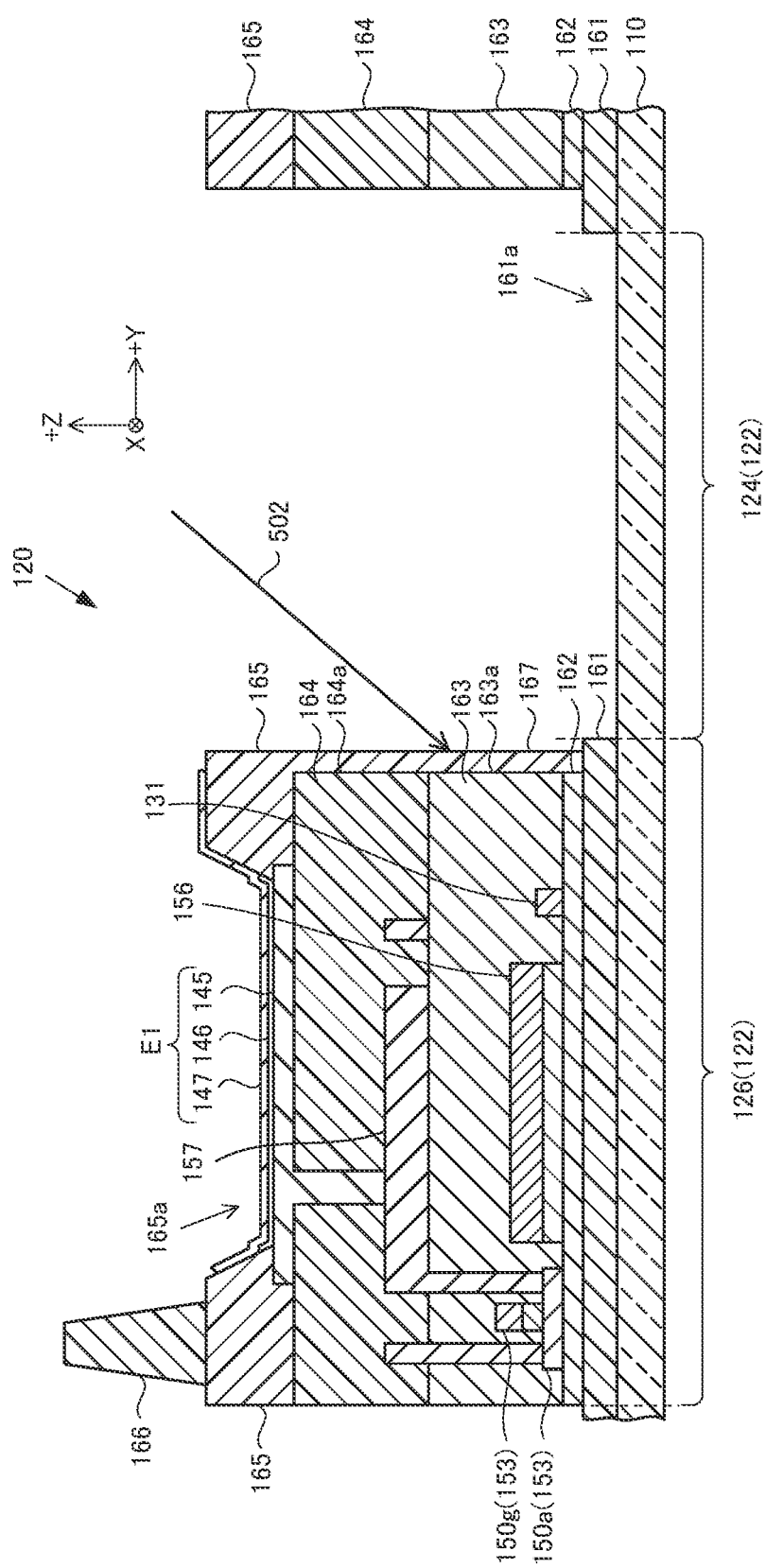
FIG. 4 is a cross-sectional view of the display region depicted in FIG. 2, taken along line A-A.
Figure 5:
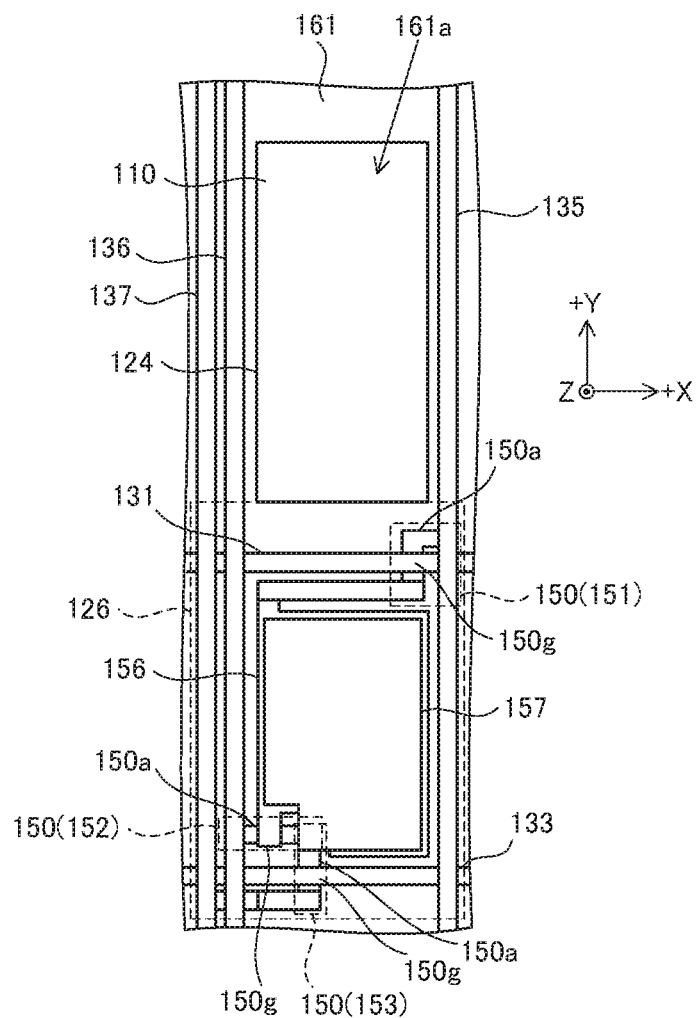
FIG. 5 is a plan view schematically illustrating the configuration of the pixel circuit according to Embodiment 1.
Figure 6:
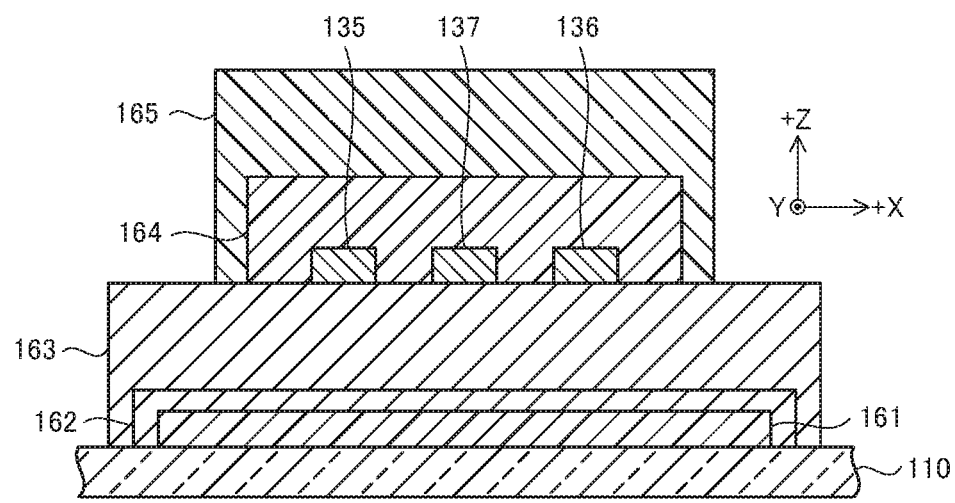
FIG. 6 is a cross-sectional view of the display region depicted in FIG. 2, taken along line B-B.

The configurations of the display region 120 and the pixel 122 of the light transmitting substrate 110 are described while referencing FIGS. 4 to 6. FIG. 4 is a cross-sectional view of the display region 120 depicted in FIG. 2, taken along line A-A. As illustrated in FIG. 4, a first light blocking layer 161, a light transmitting insulating layer 162, a first insulating layer 163, a second insulating layer 164, and a defining layer 165 are disposed in the display region 120. These layers are stacked in order, from the side of the light transmitting substrate 110, of the first light blocking layer 161, the light transmitting insulating layer 162, the first insulating layer 163, the second insulating layer 164, and the defining layer 165. In the present embodiment, the defining layer 165 functions as a second light blocking layer that blocks the external light. Furthermore, the light emitting element E1, a spacer 166, and a first light blocking wall 167 are provided in the display region 120. In the following, first, the light emitting element E1, the spacer 166, and the first light blocking wall 167 are described.

The light emitting element E1 includes the anode electrode 145, a light emitting layer 146, and a cathode electrode 147. The anode electrode 145 is provided on the second insulating layer 164 of the light emitting region 126. The light emitting layer 146 is provided in a second opening 165a of the defining layer (that is, the second light blocking layer) 165. The light emitting layer 146 is formed on the anode electrode 145 that is exposed from the second opening 165a. In one example, the light emitting layer 146 includes a hole injection layer, a hole transport layer, an organic light emitting layer, an electron transport layer, and an electron injection layer. The cathode electrode 147 is provided on the light emitting layer 146 and the defining layer (the second light blocking layer) 165. Note that, to facilitate comprehension, a portion of the cathode electrode 147 is omitted from FIG. 4. Additionally, the hatching of the light emitting layer 146 is omitted.

The spacer 166 is provided on the defining layer (the second light blocking layer) 165. The spacer 166 maintains the gap between the TFT substrate 100 and the sealing substrate 400. The spacer 166 is formed from a light transmitting resin. Note that, like the first light blocking layer 161 and the defining layer (the second light blocking layer) 165, the spacer 166 may be formed from a photosensitive resin that includes a black pigment (described later).

The first light blocking wall 167 is provided on the first light blocking layer 161 of the light emitting region 126, and blocks the external light incident on the pixel TFT 150. In the pixel 122, the first light blocking wall 167 covers a side surface 163a of the first insulating layer 163 positioned on the light transmitting region 124 side, and a side surface 164a of the second insulating layer 164 positioned on the light transmitting region 124 side. Furthermore, the first light blocking wall 167 is connected to the first light blocking layer 161 and the defining layer (the second light blocking layer) 165. Due to these configurations, the first light blocking wall 167 can block external light 502 that enters the display device 10 inclined with respect to the Z direction and is incident on the pixel TFT 150 from the light transmitting region 124.

Like the first light blocking layer 161 and the defining layer (the second light blocking layer) 165, the first light blocking wall 167 is formed from a photosensitive resin that includes a black pigment. From the perspective of the first light blocking wall 167 suppressing shifts in the threshold voltage of the pixel TFT 150, it is preferable that the product of the optical density (OD) of the first light blocking wall 167 and the thickness (μm) of the first light blocking wall 167 is 0.02 or greater. In the present embodiment, the first light blocking wall 167 and the defining layer (the second light blocking layer) 165 are integrally formed.

FIG. 5 is a plan view schematically illustrating the configuration of the pixel circuit 140. As illustrated in FIG. 5, the pixel TFT 150 and electrodes 156, 157 that constitute the pixel circuit 140 are provided in the light emitting region 126. The electrode 156 and the electrode 157 form the hold capacitor C1 of the pixel circuit 140. An active layer 150a and a gate electrode 150g of the pixel TFT 150, and the electrode 156 are provided on the light transmitting insulating layer 162 of the light emitting region 126. The electrode 157 is provided on the first insulating layer 163 of the light emitting region 126. Additionally, the gate lines 131, 133 are provided on the light transmitting insulating layer 162 and extend in the X direction. The supply wirings 135, 136, 137 are provided on the first insulating layer 163 and extend in the Y direction. Note that the drain and the source of the pixel TFT 150, the electrodes 156, 157, the supply wirings 135, 136, 137, and the like are connected through contact holes provided in the first insulating layer 163. To facilitate comprehension, the light emitting element E1, the light transmitting insulating layer 162, the first insulating layer 163, and the like are omitted from FIG. 5.

In the following, the first light blocking layer 161, the light transmitting insulating layer 162, the first insulating layer 163, the second insulating layer 164, and the defining layer 165 are described.

First, the first light blocking layer 161 will be described while referencing FIGS. 4 and 6. FIG. 6 is a cross-sectional view of the display region 120 depicted in FIG. 2, taken along line B-B. As illustrated in FIGS. 4 and 6, the first light blocking layer 161 is provided on the light transmitting substrate 110. The first light blocking layer 161 includes a first opening 161a. The first light blocking layer 161 blocks the external light that is incident on the pixel TFT 150 and the supply wirings 135, 136, 137 of the pixel circuit 140. In the present embodiment, the first light blocking layer 161 is disposed in the light emitting region 126, and the first opening 161a of the first light blocking layer 161 defines the light transmitting region 124 of the pixel 122. As illustrated in FIG. 6, the top surface and the side surfaces of the first light blocking layer 161 are covered by the light transmitting insulating layer 162 and the first insulating layer 163 between the light transmitting regions 124 of adjacent pixels 122. Due to this configuration, the layout margins of the second insulating layer 164 and the defining layer 165, and the supply wirings 135, 136, 137 formed on the first insulating layer 163 can be expanded. Furthermore, since the first light blocking layer 161 blocks external light incident on the supply wirings 135, 136, 137, the light transmitting region 124 can be expanded.

In one example, the first light blocking layer 161 is formed from a photosensitive resin that includes a black pigment. Examples of the black pigment include carbon black, benzofuranone pigments, and the like. Examples of the photosensitive resin include polyimide resins, acrylic resins, silicone resins, and the like. From the perspective of the first light blocking layer 161 suppressing shifts in the threshold voltage of the pixel TFT 150, it is preferable that the product of the optical density of the first light blocking layer 161 and the thickness (μm) of the first light blocking layer 161 is 2.82 or greater.

The light transmitting insulating layer 162 is formed from silicon nitride (SiNx), silicon oxide (SiOx), or the like. From the perspective of the electrical characteristics thereof, it is preferable that the light transmitting insulating layer 162 is formed from an inorganic material. As illustrated in FIG. 4, the light transmitting insulating layer 162 is disposed on the first light blocking layer 161. The active layer 150a and the gate electrode 150g of the pixel TFT 150 and the gate lines 131, 133 are provided on the light transmitting insulating layer 162 of the light emitting region 126. Furthermore, the electrode 156, which is one of the electrodes forming the hold capacitor C1, is provided on the light transmitting insulating layer 162 of the light emitting region 126.

The first insulating layer 163 is formed from silicon nitride (SiNx), silicon oxide (SiOx), or the like. From the perspective of the electrical characteristics thereof, it is preferable that the first insulating layer 163 is formed from an inorganic material. The first insulating layer 163 is disposed on the light transmitting insulating layer 162. The first insulating layer 163 covers the active layer 150a and the gate electrode 150g of the pixel TFT 150, the gate lines 131, 133, and the electrode 156. The electrode 157, which is the other electrode forming the hold capacitor C1, is provided on the first insulating layer 163 of the light emitting region 126. Additionally, the first insulating layer 163 is provided on the supply wirings 135, 136, 137. Furthermore, contact holes for connecting the various components are provided in the first insulating layer 163. For example, the source region of the active layer 150a of the reset TFT 153 and the supply wiring (Vref) 137 are connected via a contact holes in the first insulating layer 163.

In one example, the second insulating layer 164 is formed from a photosensitive resin (a polyimide resin, an acrylic resin, a silicone resin, or the like). The second insulating layer 164 is disposed on the first insulating layer 163. The second insulating layer 164 covers the electrode 157 and the supply wirings 135, 136, 137. Additionally, the anode electrode 145 of the light emitting element E1 is provided on the second insulating layer 164 of the light emitting region 126. The anode electrode 145 of the light emitting element E1 is connected to the drain of the driving TFT 152 and the drain of the reset TFT 153 via a contact hole in the second insulating layer 164.

The defining layer 165 functions as the second light blocking layer that blocks the external light. The defining layer 165 (that is, the second light blocking layer) blocks the external light incident on the pixel TFT 150 and the supply wirings 135, 136, 137 of the pixel circuit 140. Like the first light blocking layer 161, in one example, the defining layer 165 is formed from a photosensitive resin that includes a black pigment.

The defining layer 165 (the second insulating layer) 165 is disposed on the second insulating layer 164. In the light emitting region 126, the defining layer (the second light blocking layer) 165 covers the top surface of the second insulating layer 164 while a portion of the anode electrode 145 of the light emitting element E1 is exposed from the second opening 165a. Due to these configurations, the defining layer (the second light blocking layer) 165 can block the external light incident on the pixel TFT 150. Additionally, as illustrated in FIG. 6, the defining layer (the second light blocking layer) 165 covers the supply wirings 135, 136, 137 positioned between the light transmitting regions 124 of adjacent pixels 122. Due to this configuration, the defining layer (the second light blocking layer) 165 can block the external light incident on the supply wirings 135, 136, 137.

As described above, the first light blocking layer 161, the defining layer (the second light blocking layer) 165, and the first light blocking wall 167 of the light emitting region 126 block the external light and, as such, the display device 10 can prevent the external light from entering the pixel TFT 150. Additionally, the display device 10 can suppress reflecting of the external light by the electrodes 156, 157, the anode electrode 145 of the light emitting element E1, the wirings, and the like disposed in the light emitting region 126. Furthermore, the supply wirings 135, 136, 137 are disposed on the first light blocking layer 161 and the defining layer (the second light blocking layer) 165 covers the supply wirings 135, 136, 137. As such, the display device 10 can suppress reflecting of the external light by the supply wirings 135, 136, 137.

Production Method

Next, a production method for the display device 10 is described. First, a production method for the TFT substrate 100 is described. Here, the forming of the pixel 122 is mainly described, but the driver circuit 200 may be formed together with the pixel 122 by a known method.

First, the photosensitive resin that includes the black pigment is applied on the light transmitting substrate 110. The applied photosensitive resin is exposed and developed. Then, the developed photosensitive resin is baked to form, on the light transmitting substrate 110, the first light blocking layer 161 that includes the first opening 161a.

Next, silicon oxide, for example, is deposited on the first light blocking layer 161 by chemical vapor deposition (CVD) or sputtering, thereby forming the light transmitting insulating layer 162.

An oxide semiconductor layer is laminated, by sputtering, on the light transmitting insulating layer 162 of the light emitting region 126. Then, the laminated oxide semiconductor layer is etched to form the active layer 150a of the pixel TFT 150. In one example, the oxide semiconductor layer is formed from an oxide that contains indium, gallium, and zinc.

Next, in one example, silicon oxide is deposited on the active layer 150a by CVD or sputtering to form a gate insulating membrane. Then, a metal material is deposited by sputtering and, thereafter, the gate insulating membrane and the deposited metal are etched to form the gate electrode 150g of the pixel TFT 150, the electrode 156, the gate lines 131, 133, and the like. In one example, the gate insulating membrane is formed from silicon oxide. Examples of the metal material include aluminum (Al), molybdenum (Mo), tungsten (W), and the like.

Then, silicon oxide, for example, is deposited on the light transmitting insulating layer 162, the gate electrode 150g of the pixel TFT 150, the gate lines 131, 133, and the like, to form the first insulating layer 163. The first insulating layer 163 is etched to form the contact holes. Furthermore, after depositing the metal material on the first insulating layer 163 by sputtering, etching is performed, and the electrode 157, the supply wirings 135, 136, 137, and the like are formed. After forming the electrode 157, the supply wirings 135, 136, 137, and the like, the light transmitting insulating layer 162 and the first insulating layer 163 of the light transmitting region 124 are removed by etching.

Next, the photosensitive resin is applied, and the applied photosensitive resin is exposed and developed. The developed photosensitive resin is baked to form the second insulating layer 164 on the first insulating layer 163, the electrode 157, the supply wirings 135, 136, 137, and the like. In the present embodiment, a positive photosensitive resin is used to form the second insulating layer 164 and, as such, the contact holes in the second insulating layer 164 through which the pixel TFT 150 is connected to the anode electrode 145 of the light emitting element E1 can easily be made smaller. Since small contact holes can be formed, a high definition display device 10 can easily be produced. Additionally, the light emitting area of the light emitting element E1 can be enlarged.

The anode electrode 145 of the light emitting element E1 is formed on the second insulating layer 164 of the light emitting region 126 by sputtering. In one example, the anode electrode 145 includes three layers of indium tin oxide (ITO) and aluminum alloy or silver ally and ITO.

Next, the photosensitive resin that includes the black pigment is applied, and the applied photosensitive resin is exposed and developed. The developed photosensitive resin is baked, thereby integrally forming the first light blocking wall 167 and the defining layer (the second light blocking layer) 165 that includes the second opening 165a. Furthermore, the photosensitive resin is used to form the spacer 166 on the defining layer (the second light blocking layer) 165.

After forming the spacer 166, the light emitting layer 146 of the light emitting element E1 is formed, by vapor deposition, on the anode electrode 145 of the light emitting element E1. Furthermore, the cathode electrode 147 of the light emitting element E1 is formed, by vapor deposition, on the light emitting layer 146, the defining layer (the second light blocking layer) 165, and the first light blocking wall 167. The cathode electrode 147 is formed from lithium (Li), aluminum, magnesium (Mg), ytterbium (Yb), alloys thereof, or the like. The TFT substrate 100 is produced as described above.

Next, the produced TFT substrate 100 and the sealing substrate 400 are joined by glass frit. Then, the driver IC 300 and the FPC 310 are mounted on the TFT substrate 100. Thus, the display device 10 can be produced.

As described above, the display device 10 includes, in the light emitting region 126 of the pixel 122, the first light blocking layer 161, the defining layer (the second light blocking layer) 165, and the first light blocking wall 167 and, as such, the external light can be prevented from entering the pixel TFT 150. Additionally, the display device 10 can suppress reflecting of the external light by the anode electrode 145, the wirings, and the like of the light emitting element E1. Furthermore, the supply wirings 135, 136, 137 disposed on the first light blocking layer 161 are covered by the defining layer (the second light blocking layer) 165 and, as such, the display device 10 can suppress reflecting of the external light by the supply wirings 135, 136, 137.

Embodiment 2

Figure 7:
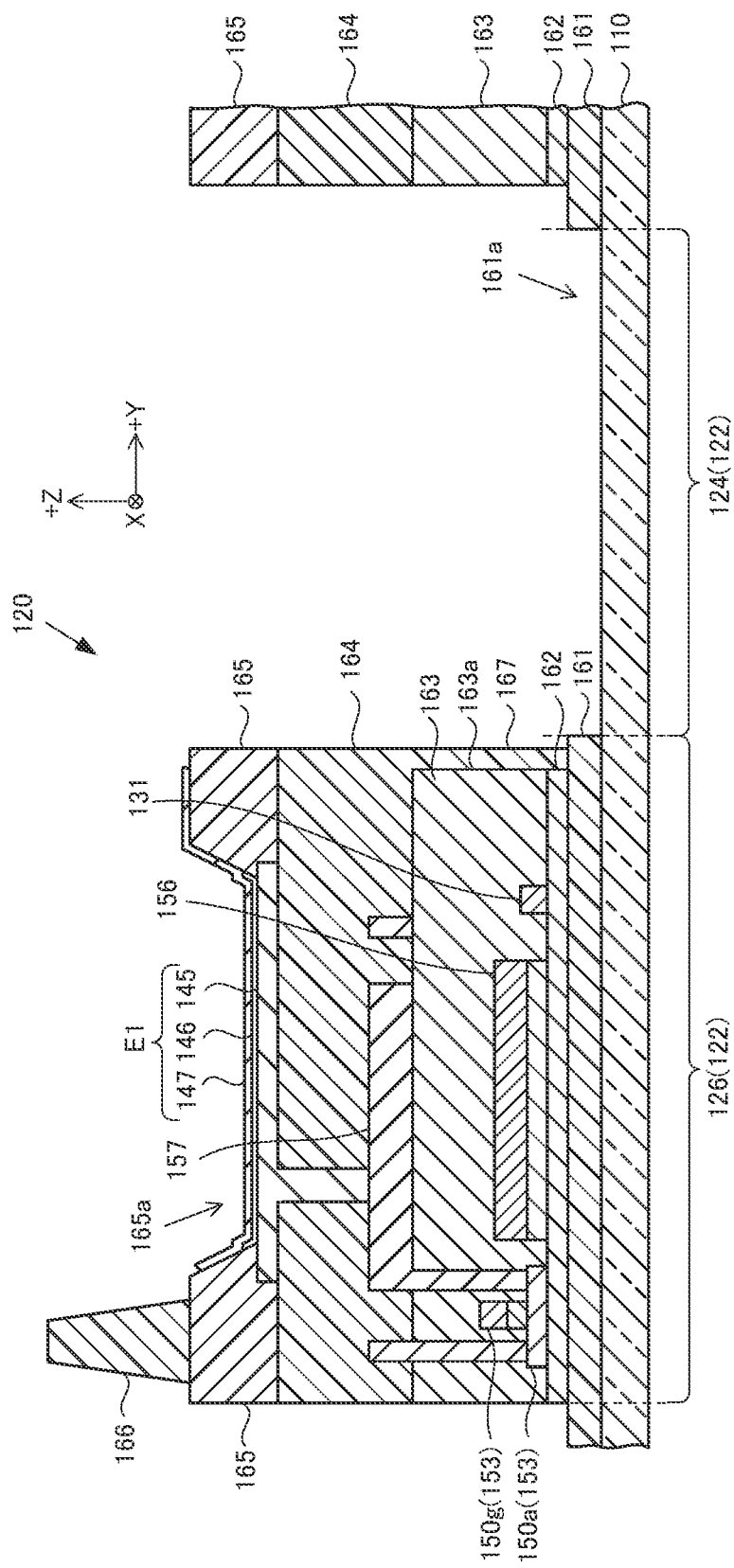
FIG. 7 is a cross-sectional view illustrating a display region according to Embodiment 2.

In Embodiment 1, the defining layer 165 functions as the second light blocking layer. However, a configuration in which another layer functions as the second light blocking layer may be provided. Hereinafter, a second insulating layer 164, a defining layer 165, and a first light blocking wall 167 of the present embodiment will be described while referencing FIG. 7.

In the present embodiment, the configurations of the second insulating layer 164, the defining layer 165, and the first light blocking wall 167 differ from the configurations of the second insulating layer 164, the defining layer 165, and the first light blocking wall 167 of Embodiment 1. Specifically, the defining layer 165 and the first light blocking wall 167 of the present embodiment are not integrally formed, whereas the second insulating layer 164 and the first light blocking wall 167 are integrally formed. The other configurations of the present embodiment are the same as described in Embodiment 1.

Like the first light blocking wall 167 of Embodiment 1, the first light blocking wall 167 of the present embodiment is provided on the first light blocking layer 161 of the light emitting region 126, and blocks the external light that is incident on the pixel TFT 150. The first light blocking wall 167 of the present embodiment covers a side surface 163a of the first insulating layer 163 positioned on the light transmitting region 124 side in the pixel 122. Furthermore, the first light blocking wall 167 is connected to the first light blocking layer 161 and the second insulating layer (the second light blocking layer, described later) 164. Like the first light blocking layer 161 of Embodiment 1, the first light blocking wall 167 is formed from a photosensitive resin that includes a black pigment.

Like the defining layer 165 of Embodiment 1, the second insulating layer 164 of the present embodiment functions as a second light blocking layer that blocks the external light.

The second insulating layer (that is, the second light blocking layer) 164 of the present embodiment blocks the external light that is incident on the pixel TFT 150 and the supply wirings 135, 136, 137 of the pixel circuit 140. Like the first light blocking layer 161 of Embodiment 1, the second insulating layer (the second light blocking layer) 164 of the present embodiment is formed from a photosensitive resin that includes a black pigment, for example. The second insulating layer (the second light blocking layer) 164 and the first light blocking wall 167 of the present embodiment are integrally formed.

The second insulating layer (the second light blocking layer) 164 of the present embodiment is disposed on the first insulating layer 163 and covers the electrode 157 and the supply wirings 135, 136, 137. Like in Embodiment 1, the anode electrode 145 of the light emitting element E1 is provided on the second insulating layer 164 of the light emitting region 126.

Like the defining layer 165 of Embodiment 1, the defining layer 165 of the present embodiment functions as a second light blocking layer. The defining layer (the second light blocking layer) 165 of the present embodiment blocks the external light that is incident on the pixel TFT 150 and the supply wirings 135, 136, 137 of the pixel circuit 140.

As described above, the first light blocking layer 161, the second insulating layer (the second light blocking layer) 164, the defining layer (the second light blocking layer) 165, and the first light blocking wall 167 of the light emitting region 126 block the external light and, as such, the display device 10 of the present embodiment can prevent the external light from entering the pixel TFT 150. Additionally, the display device 10 of the present embodiment can suppress reflecting of the external light by the electrodes 156, 157, the anode electrode 145 of light emitting element E1, the wirings, and the like. Furthermore, like the display device 10 of Embodiment 1, the display device 10 of the present embodiment can suppress reflecting of the external light by the supply wirings 135, 136, 137.

In the present embodiment, the second insulating layer 164 and the defining layer 165 function as second light blocking layers and, as such, the display device 10 can further prevent the external light from entering the pixel TFT 150 and reflecting of the external light by the anode electrode 145 of the light emitting element E1, the wirings, and the like. Additionally, the height of the first light blocking wall 167 can be made lower than the height of the first light blocking wall 167 of Embodiment 1 and, as such, the display device 10 can be easily produced.

Embodiment 3

In Embodiments 1 and 2, the first light blocking wall 167 is provided on the first light blocking layer 161. However, a configuration in which another light blocking wall is provided on the first light blocking layer 161 may be provided.

Figure 8:
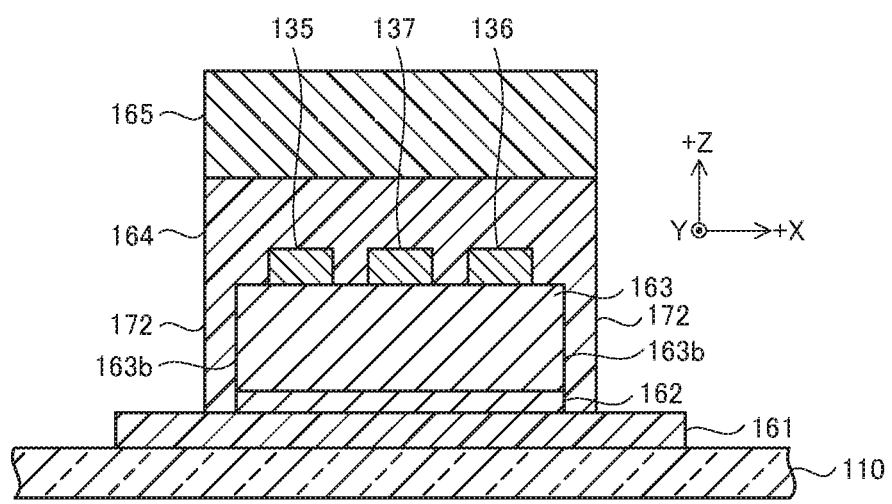
FIG. 8 is a cross-sectional view illustrating a second light blocking wall according to Embodiment 3.

Hereinafter, a second light blocking wall 172 is described while referencing FIG. 8. FIG. 8 is a cross-sectional view of the display region 120 depicted in FIG. 2, taken along line B-B. The configuration of the display device 10 of the present embodiment is the same as the configuration of the display device 10 of Embodiment 2, except that the second light blocking wall 172 is provided.

In the present embodiment, as illustrated in FIG. 8, the second light blocking wall 172 that blocks the external light covers a side surface 163b of the first insulating layer 163 on which the supply wirings 135, 136, 137 are disposed. Furthermore, the second light blocking wall 172 is connected to the first light blocking layer 161 and the second insulating layer (the second light blocking layer) 164. Due to these configurations, the second light blocking wall 172 can block the external light that transmits through the first insulating layer 163 and is incident on the supply wirings 135, 136, 137.

Like the first light blocking wall 167, the second insulating layer (the second light blocking layer) 164 5, and the defining layer (the second light blocking layer) 165, the second light blocking wall 172 is formed from a photosensitive resin that includes a black pigment. In the present embodiment, the second light blocking wall 172 and the second insulating layer (the second light blocking layer) 164 are integrally formed.

In the present embodiment, the second light blocking wall 172, the second insulating layer (the second light blocking layer) 164, and the defining layer (the second light blocking layer) 165 block the external light that is incident on the supply wirings 135, 136, 137 and, as such, reflecting of the external light by the supply wirings 135, 136, 137 can be further suppressed. Additionally, like the display device 10 of Embodiment 2, the display device 10 of the present embodiment can prevent the external light from entering the pixel TFT 150, and also can suppress reflecting of the external light by the electrodes 156, 157, the anode electrode 145, and the like.

Embodiment 4

In Embodiments 1 and 2, the first light blocking wall 167 is provided in the light emitting region 126 of the pixel 122. However, a configuration in which another light blocking wall is provided in the pixel 122 may be provided.

The configuration of the display device 10 of the present embodiment is the same as the configuration of the display device 10 of Embodiment 2, except that a third light blocking wall 173 is provided. Hereinafter, the third light blocking wall 173 is described while referencing FIG. 9.

Figure 9:
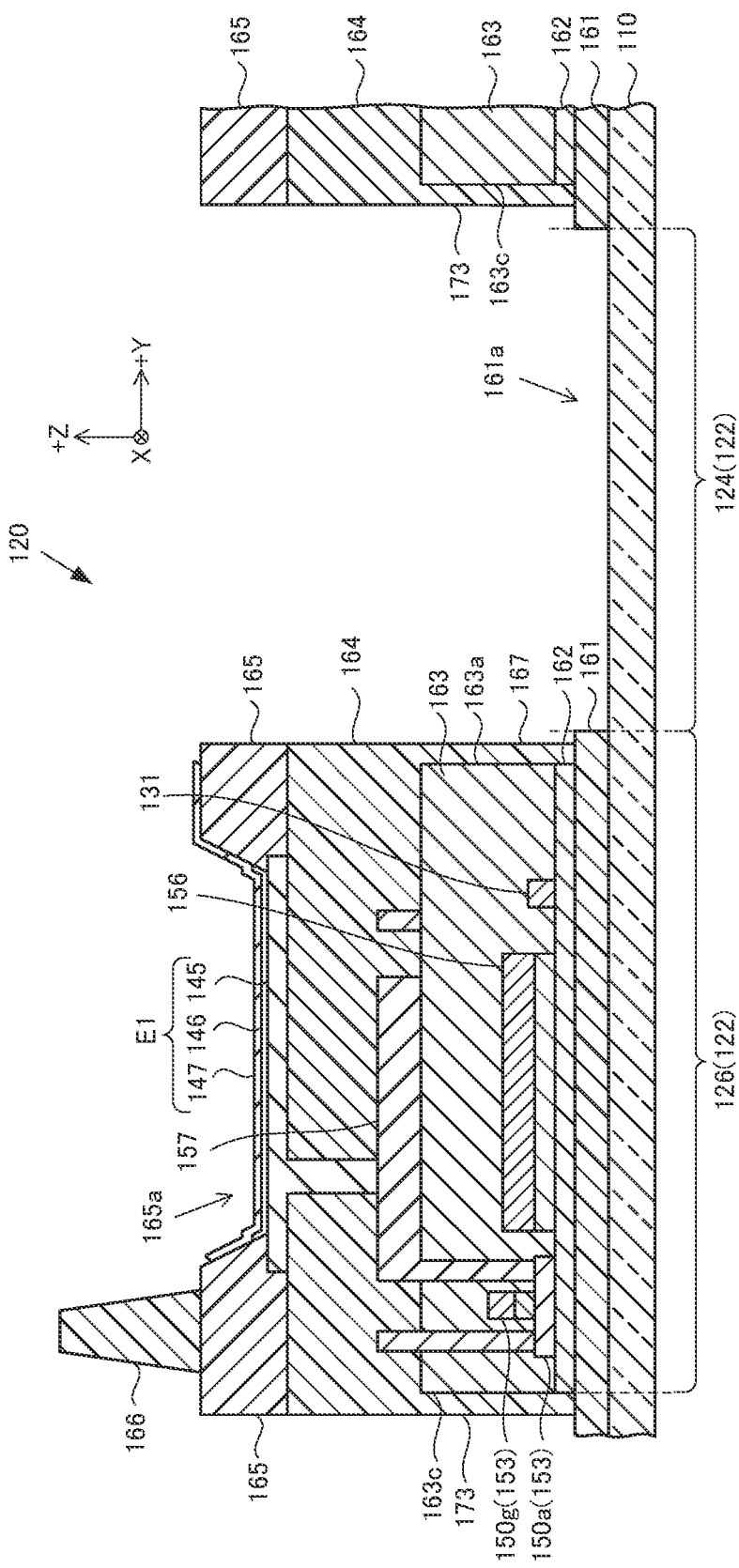
FIG. 9 is a cross-sectional view illustrating a display region according to Embodiment 4.

As illustrated in FIG. 9, the third light blocking wall 173 that blocks the external light covers a side surface 163c of the first insulating layer 163 opposite to the first light blocking wall 167. Furthermore, the third light blocking wall 173 is connected to the first light blocking layer 161 and the second insulating layer (the second light blocking layer) 164. Like the first light blocking wall 167 and the second insulating layer (the second light blocking layer) 164, the third light blocking wall 173 is formed from a photosensitive resin that includes a black pigment. In the present embodiment, the third light blocking wall 173 and the second insulating layer (the second light blocking layer) 164 are integrally formed.

The third light blocking wall 173 covers the side surface 163c of the first insulating layer 163 opposite to the first light blocking wall 167 and, as such, the display device 10 can block the external light that is incident on the pixel TFT 150 from the light transmitting region 124 side of the adjacent pixel 122. In the present embodiment, the third light blocking wall 173 and the first light blocking wall 167 block the external light that is incident on the pixel TFT 150 and, as such, the display device 10 can further prevent the external light from entering the pixel TFT 150. Additionally, like the display device 10 of Embodiment 2, the display device 10 of the present embodiment can suppress reflecting of the external light by the electrodes 156, 157, the anode electrode 145, the supply wirings 135, 136, 137, and the like. Note that, as with the first light blocking wall 167, it is preferable that the product of the optical density of the third light blocking wall 173 and the thickness (μm) of the third light blocking wall 173 is 0.02 or greater.

Embodiment 5

In Embodiments 1 to 4, in the pixel 122, the first light blocking wall 167 covers the side surface 163a of the first insulating layer 163 positioned on the light transmitting region 124 side, and the side surface 164a of the second insulating layer 164 positioned on the light transmitting region 124 side. However, a configuration in which the first light blocking wall 167 is provided in the first insulating layer 163 may be provided. Additionally, in Embodiments 1 to 4, the defining layer 165, or the second insulating layer 164 and the defining layer 165 function as second light blocking layers. However, a configuration in which a second light blocking layer is provided separately from the second insulating layer 164 and the defining layer 165 may be provided.

A display region 120 of the present embodiment is described while referencing FIGS. 10 to 13. To facilitate comprehension, the light transmitting insulating layer 162, the first insulating layer 163, the second light blocking layer 180, the second insulating layer 164, the defining layer 165, and the like are omitted from FIG. 11. Additionally, the second insulating layer 164, the defining layer 165, and the like are omitted from FIG. 12.

Figure 10:
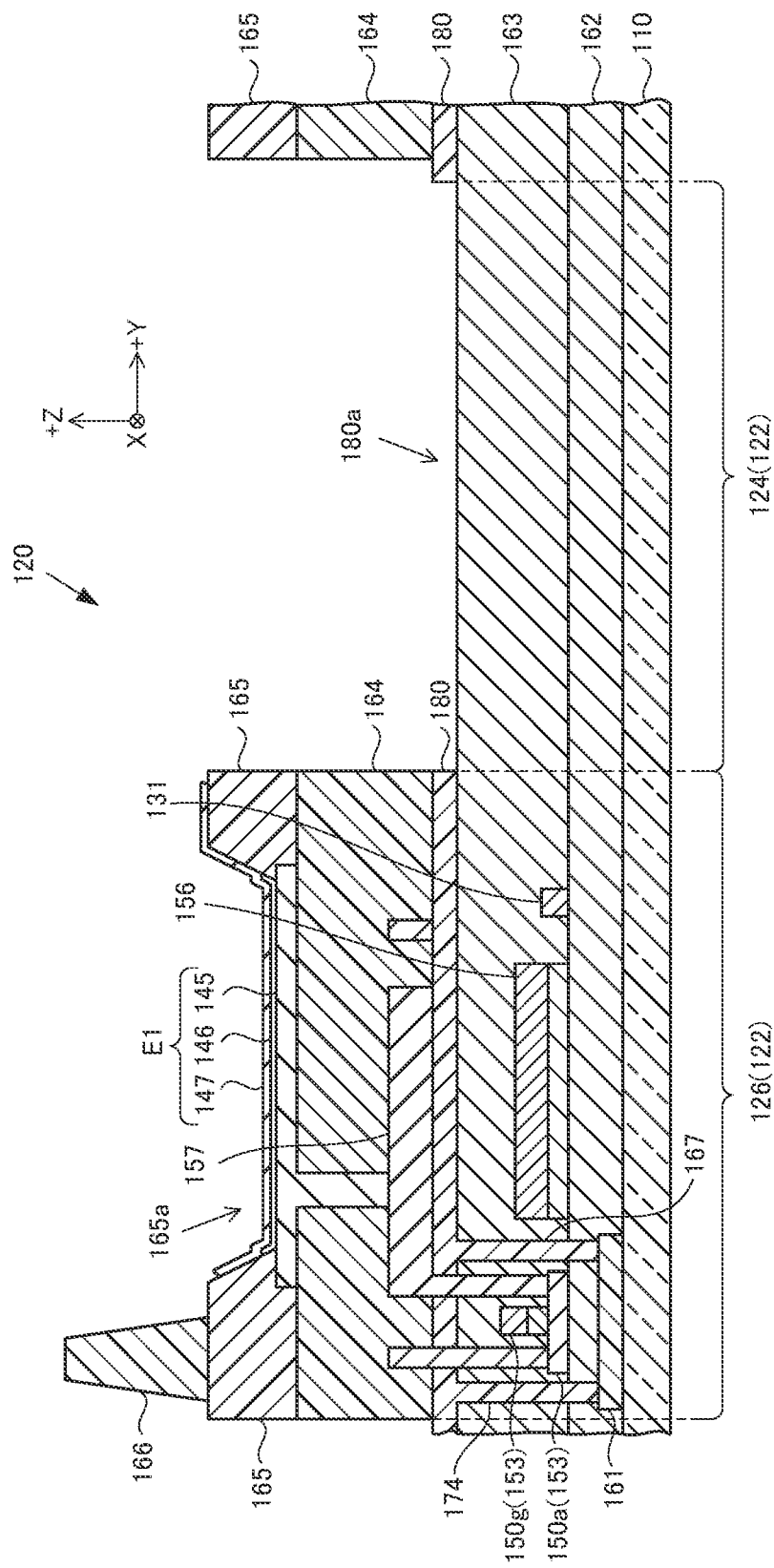
FIG. 10 is a cross-sectional view illustrating a display region according to Embodiment 5.

In the present embodiment, as illustrated in FIG. 10, the second light blocking layer 180 that blocks external light is provided between the first insulating layer 163 and the second insulating layer 164. The first light blocking wall 167 of the present embodiment penetrates the first insulating layer 163 and the light transmitting insulating layer 162 in the light emitting region 126 and is connected to the first light blocking layer 161 and the second light blocking layer 180. Furthermore, in the present embodiment, a fourth light blocking wall 174 is provided. The fourth light blocking wall 174 is connected to the first light blocking wall 167. Additionally, together with the first light blocking wall 167, the fourth light blocking wall 174 surrounds the active layer 150a of the pixel TFT 150. In this case, the configurations of the light emitting element E1 and the spacer 166 are the same as in Embodiment 1 and, as such, the configurations of the other constituents are described.

Figure 11:
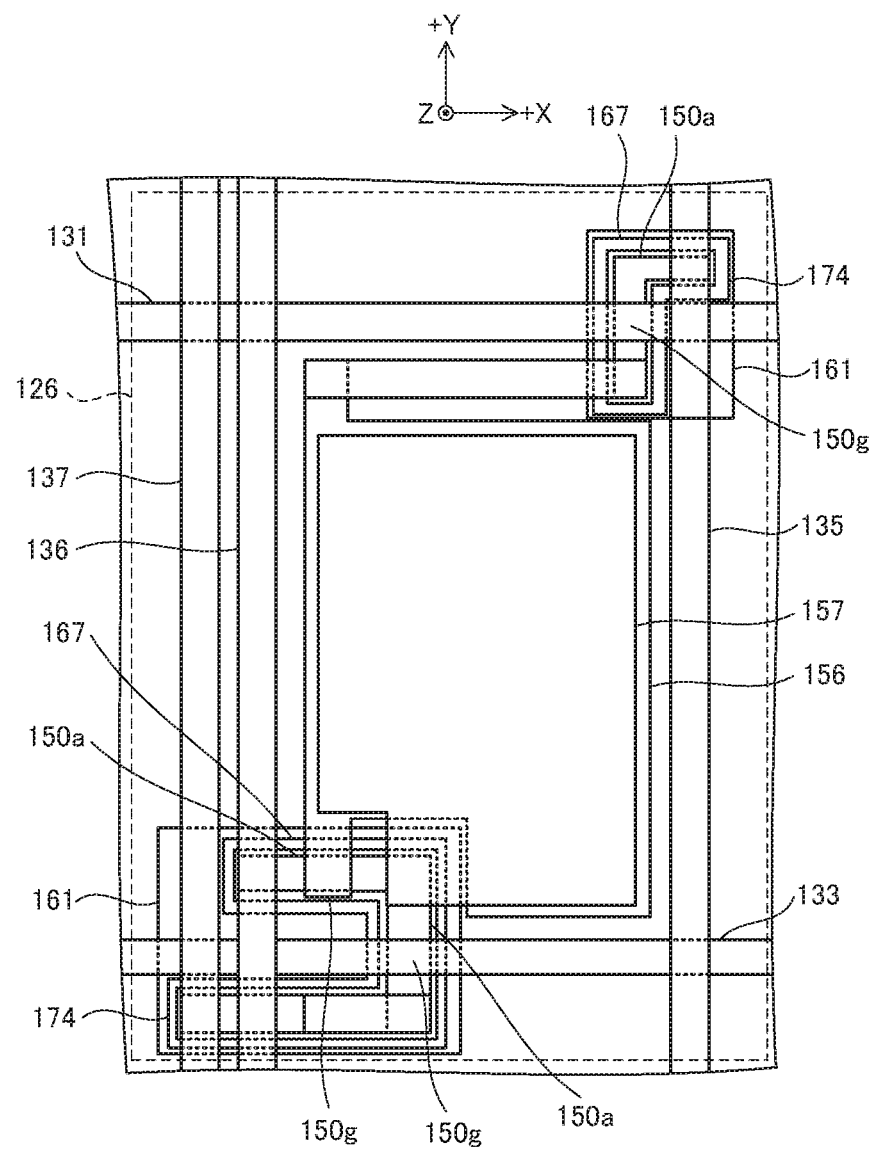
FIG. 11 is a plan view illustrating the display region according to Embodiment 5.

The first light blocking layer 161 of the present embodiment blocks the external light that is incident on the pixel TFT 150. As illustrated in FIGS. 10 and 11, the first light blocking layer 161 of the present embodiment is provided on the light transmitting substrate 110, at a position that corresponds to the active layer 150a of the pixel TFT 150. The other configurations of the first light blocking layer 161 of the present embodiment are the same as the first light blocking layer 161 of Embodiment 1. As described later, the light transmitting region 124 is defined by the second light blocking layer 180.

As illustrated in FIG. 10, the light transmitting insulating layer 162 of the present embodiment covers the first light blocking layer 161 and the light transmitting substrate 110. Accordingly, in the present embodiment, the light transmitting insulating layer 162 is disposed in the light transmitting region 124 and the light emitting region 126. The light transmitting insulating layer 162 of the present embodiment is penetrated by the first light blocking wall 167 and the fourth light blocking wall 174 in the light emitting region 126. That is, the first light blocking wall 167 and the fourth light blocking wall 174 are disposed in the light transmitting insulating layer 162 of the light emitting region 126. The other configurations of the light transmitting insulating layer 162 of the present embodiment are the same as the light transmitting insulating layer 162 of Embodiment 1.

The first insulating layer 163 of the present embodiment is formed from silicon nitride, silicon oxide, or the like. The first insulating layer 163 of the present embodiment is disposed on the light transmitting insulating layer 162. The first insulating layer 163 of the present embodiment covers the active layer 150a and the gate electrode 150g of the pixel TFT 150, the gate lines 131, 133, and the electrode 156. The first insulating layer 163 of the present embodiment is penetrated by the first light blocking wall 167 and the fourth light blocking wall 174 in the light emitting region 126. That is, the first light blocking wall 167 and the fourth light blocking wall 174 are disposed in the first insulating layer 163 of the light emitting region 126. Note that, like the light transmitting insulating layer 162 of the present embodiment, the first insulating layer 163 of the present embodiment is disposed in the light transmitting region 124 and the light emitting region 126.

Figure 12:
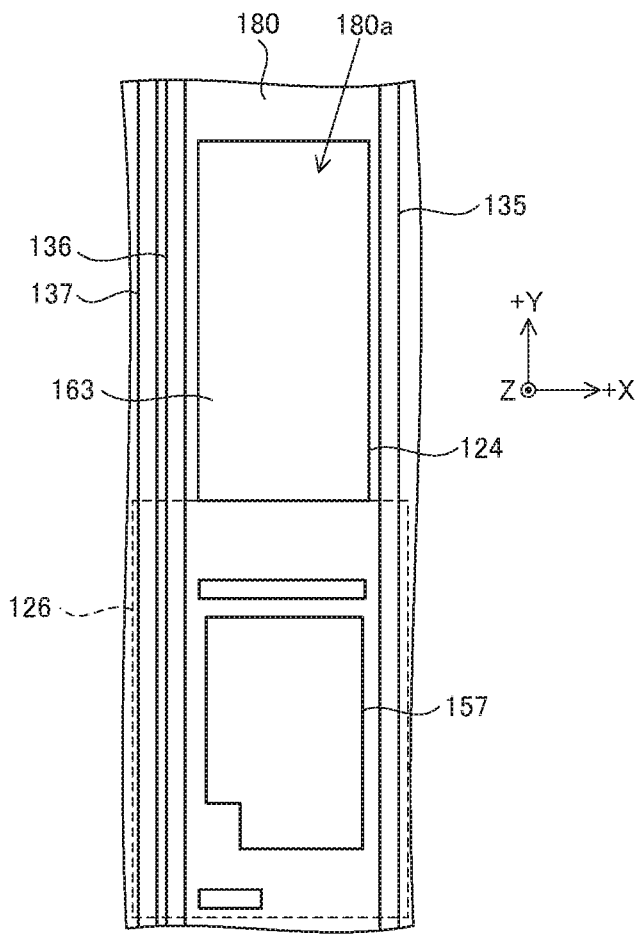
FIG. 12 is a plan view illustrating the display region according to Embodiment 5.

The second light blocking layer 180 has insulating properties and blocks the external light that is incident on the pixel TFT 150 and the supply wirings 135, 136, 137. Like the first light blocking layer 161 of Embodiment 1, the second light blocking layer 180 is formed from a photosensitive resin that includes a black pigment. As illustrated in FIG. 10, the second light blocking layer 180 is disposed on the first insulating layer 163. Additionally, as illustrated in FIGS. 10 and 12, the second light blocking layer 180 includes a third opening 180a. The third opening 180a of the second light blocking layer 180 defines the light transmitting region 124. As illustrated in FIGS. 11 and 12, the electrode 157 and the supply wirings 135, 136, 137 are provided on the second light blocking layer 180.

The first light blocking wall 167 of the present embodiment blocks the external light that is incident on the pixel TFT 150. As illustrated in FIG. 10, the first light blocking wall 167 of the present embodiment is provided in the first insulating layer 163 and in the light transmitting insulating layer 162 of the light emitting region 126, and is connected to the first light blocking layer 161 and the second light blocking layer 180. Specifically, the first light blocking wall 167 of the present embodiment penetrates the first insulating layer 163 and the light transmitting insulating layer 162 at a position in the light emitting region 126 more to the light transmitting region 124 side than the active layer 150a of the pixel TFT 150, and is connected to the first light blocking layer 161 and the second light blocking layer 180. Due to these configurations, the first light blocking wall 167 of the present embodiment can block the external light that enters the display device 10 inclined with respect to the Z direction, and is incident on the pixel TFT 150 from the light transmitting region 124. Furthermore, since the first light blocking wall 167 is provided in the first insulating layer 163 and in the light transmitting insulating layer 162 of the light emitting region 126, the layout margins of the light transmitting region 124 and the light emitting region 126 can be reduced, and the light transmitting region 124 can be made larger.

The first light blocking wall 167 of the present embodiment is integrally formed with the second light blocking layer 180. The other configurations of the first light blocking wall 167 of the present embodiment are the same as the first light blocking wall 167 of Embodiment 1.

Like the second light blocking layer 180, the fourth light blocking wall 174 is formed from a photosensitive resin that includes a black pigment. The fourth light blocking wall 174 is integrally formed with the second light blocking layer 180. Like the first light blocking wall 167 of the present embodiment, the fourth light blocking wall 174 is provided in the first insulating layer 163 and in the light transmitting insulating layer 162 of the light emitting region 126. The fourth light blocking wall 174 penetrates the first insulating layer 163 and the light transmitting insulating layer 162, and is connected to the first light blocking layer 161 and the second light blocking layer 180. Furthermore, as illustrated in FIG. 11, the fourth light blocking wall 174 is connected to the first light blocking layer 161 and, together with the first light blocking wall 167, surrounds the active layer 150a of the pixel TFT 150. In the present embodiment, since the first light blocking wall 167 and the fourth light blocking wall 174 surround the active layer 150a of the pixel TFT 150, the external light that is incident on the pixel TFT 150 from the light transmitting region 124 side of the adjacent pixel 122 can be blocked.

Figure 13:
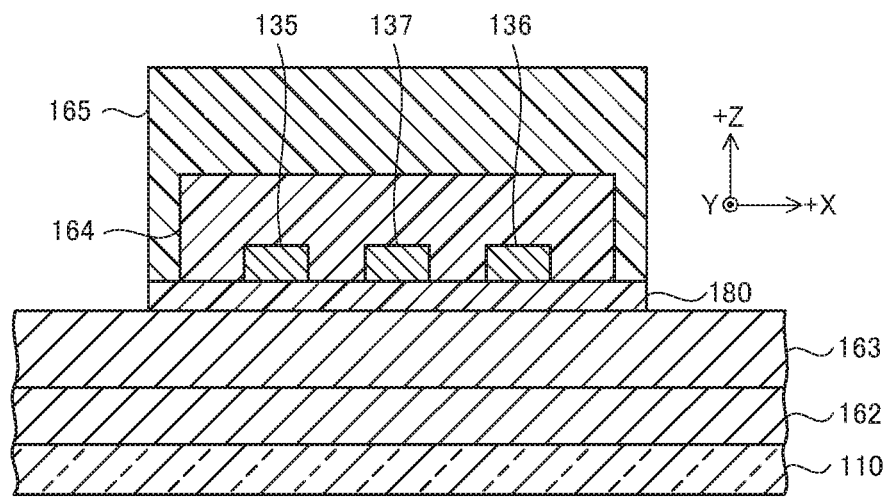
FIG. 13 is a cross-sectional view illustrating a second light blocking wall, a supply wiring, a second insulating layer, and a defining layer according to Embodiment 5.

The second insulating layer 164 of the present embodiment is disposed on the second light blocking layer 180. The second insulating layer 164 of the present embodiment covers the electrode 157, the wirings, and the like in the light emitting region 126. Furthermore, as illustrated in FIG. 13, the second insulating layer 164 of the present embodiment covers the supply wirings 135, 136, 137. Like the second insulating layer 164 of Embodiment 1, the defining layer 165 of the present embodiment is formed from a photosensitive resin (a polyimide resin, an acrylic resin, a silicone resin, or the like). The other configurations of the second insulating layer 164 and the defining layer 165 of the present embodiment are the same as the second insulating layer 164 and the defining layer 165 of Embodiment 1.

As described above, the first light blocking layer 161, the second light blocking layer 180, and the first light blocking wall 167 of the light emitting region 126 block the external light and, as such, the display device 10 can prevent the external light from entering the pixel TFT 150. Additionally, since the supply wirings 135, 136, 137 are disposed on the second light blocking layer 180, the display device 10 can suppress reflecting of the external light by the supply wirings 135, 136, 137. Since the first light blocking wall 167 and the fourth light blocking wall 174 surround the active layer 150a of the pixel TFT 150, the external light that is incident on the pixel TFT 150 can be blocked even more. Furthermore, since it is not necessary to remove the light transmitting insulating layer 162 and the first insulating layer 163 of the light transmitting region 124, the step of etching the light transmitting insulating layer 162 and the first insulating layer 163 can be omitted, and the display device 10 can be more easily produced.

Embodiment 6

The display devices 10 of Embodiments 1 to 5 do not include a light blocking wall outside the display region 120. However, a configuration in which the display device 10 includes a light blocking wall outside the display region 120 may be provided.

Figure 14:
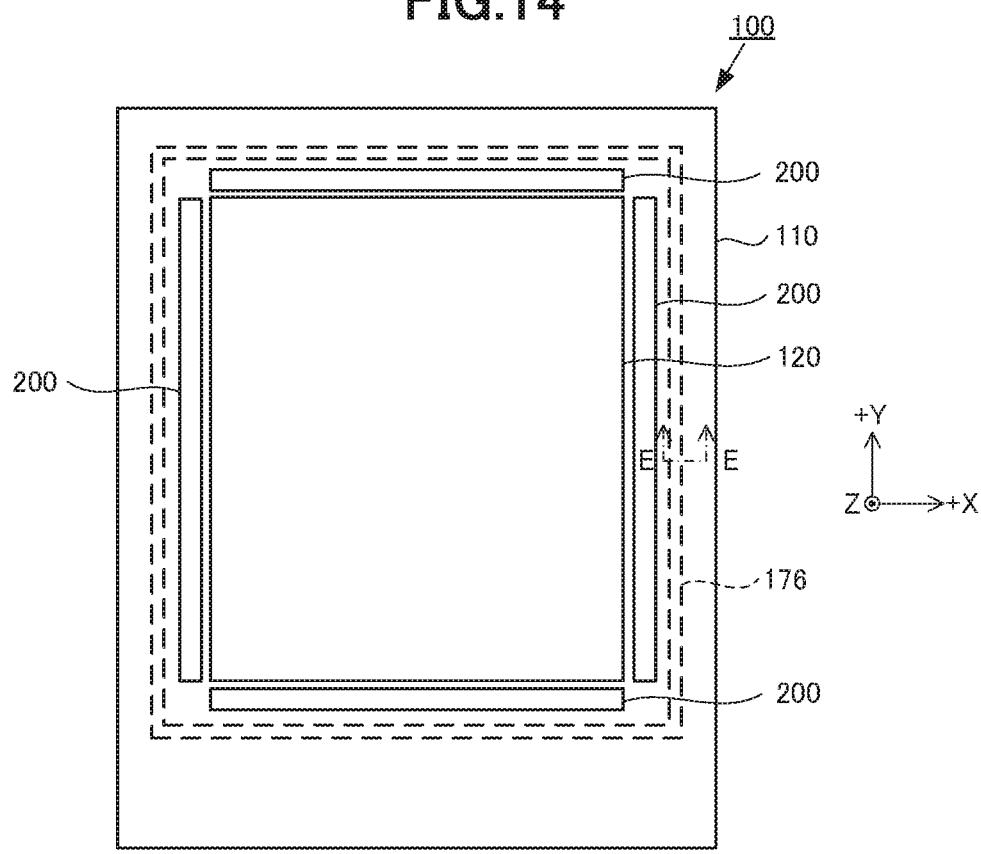
FIG. 14 is a plan view illustrating a TFT substrate according to Embodiment 6.
Figure 15:
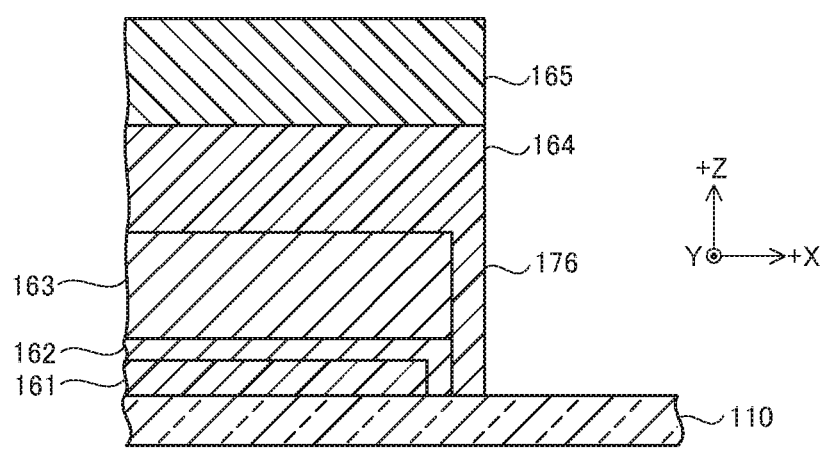
FIG. 15 is a cross-sectional view illustrating the TFT substrate depicted in FIG. 14, taken along line E-E.

The configuration of the display device 10 of the present embodiment is the same as the configuration of the display device 10 of Embodiment 2, except that a fifth light blocking wall 176 is provided. Hereinafter, the fifth light blocking wall 176 is described while referencing FIGS. 14 and 15. FIG. 14 is a plan view illustrating a TFT substrate 100. FIG. 15 is a cross-sectional view illustrating the TFT substrate 100 depicted in FIG. 14, taken along line E-E.

As illustrated in FIG. 14, when viewed from above, the fifth light blocking wall 176 that blocks the external light surrounds the display region 120 and the driver circuit 200. Like the first light blocking wall 167 and the second insulating layer (the second light blocking layer) 164, the fifth light blocking wall 176 is formed from a photosensitive resin that includes a black pigment. As illustrated in FIG. 15, in the present embodiment, the fifth light blocking wall 176 and the second insulating layer (the second light blocking layer) 164 are integrally formed.

The fifth light blocking wall 176 surrounds the display region 120 and the driver circuit 200 and, as such, the display device 10 can further prevent the external light from entering the pixel TFT 150. Additionally, like the display device 10 of Embodiment 2, the display device 10 of the present embodiment can suppress reflecting of the external light by the electrodes 156, 157, the anode electrode 145, the supply wirings 135, 136, 137, and the like. Note that, in the present embodiment, the second insulating layer 164 and the defining layer 165 are not provided on the connection wiring (not illustrated in the drawings) that connects the driver circuit 200 to the driver IC 300. In this case, the connection wiring is provided on the first insulating layer 163.

MODIFIED EXAMPLES

Embodiments have been described, but various modifications can be made to the present disclosure without departing from the spirit and scope of the present disclosure.

For example, the pixel circuit 140 of Embodiment 1 includes the switching TFT 151, the driving TFT 152, and the reset TFT 153, but the configuration of the pixel circuit 140 is not limited thereto. A configuration in which the reset TFT 153 is not included may be provided. Additionally, a configuration in which the pixel circuit 140 includes thin film transistors that have other functions may be provided.

The display devices 10 of Embodiments 1 to 6 include the light emitting element E1 as the light emitting element. A configuration in which the display device 10 includes other light emitting elements may be provided. For example, the display device 10 may include a quantum dot light emitting element. Additionally, the arrangement of the pixel 122 of the display device 10 is not limited to a striped array. The arrangement of the pixel 122 of the display device 10 may be a Bayer array, a PenTile array, or the like. In the display devices 10 of Embodiments 1 to 6, the sealing substrate 400 seals the TFT substrate 100. However, a configuration in which the TFT substrate 100 in the display device 10 is sealed by thin film sealing using an organic film or an inorganic film may be provided.

In Embodiment 1, the display device 10 includes the three supply wirings 135, 136, 137. However, a configuration in which the display device 10 does not include the supply wiring (Vref) 137 that functions as the reference voltage line may be provided. Additionally, a configuration in which the display device 10 includes supply wirings that have other functions may be provided. Furthermore, the defining layer (the second light blocking layer) 165 of Embodiment 1 covers the three supply wirings 135, 136, 137. However, it is sufficient that the defining layer (the second light blocking layer) 165 covers at least one of the three supply wirings 135, 136, 137.

In Embodiment 2, the second insulating layer 164 and the defining layer 165 function as second light blocking layers. However, a configuration in which only the second insulating layer 164 functions as a second light blocking layer may be provided. That is, it is sufficient that at least one of the second insulating layer 164 and the defining layer 165 functions as a second light blocking layer.

Furthermore, in Embodiments 1 to 4, and 6, the layers that function as second light blocking layers are not limited to the second insulating layer 164 and the defining layer 165. It is sufficient that the second light blocking layer is a layer that is disposed on the first insulating layer 163, covers the pixel TFT 150, and blocks the external light.

In Embodiment 1, the first light blocking wall 167 and the defining layer (the second light blocking layer) 165 are integrally formed. In Embodiment 2, the second light blocking wall 167 and the second insulating layer (the second light blocking layer) 164 are integrally formed. However, configurations in which the first light blocking wall 167 and defining layer (the second light blocking layer) 165 or the second insulating layer (the second light blocking layer) 164 are formed separately may be provided. Configurations in which the second light blocking wall 172, the third light blocking wall 173, and the fifth light blocking wall 176 are formed separately from the defining layer (the second light blocking layer) 165 or the second insulating layer (the second light blocking layer) 164 may be provided. Additionally, in Embodiment 5, the first light blocking wall 167, the fourth light blocking wall 174, and the second light blocking layer 180 may be formed separately.

Figure 16:
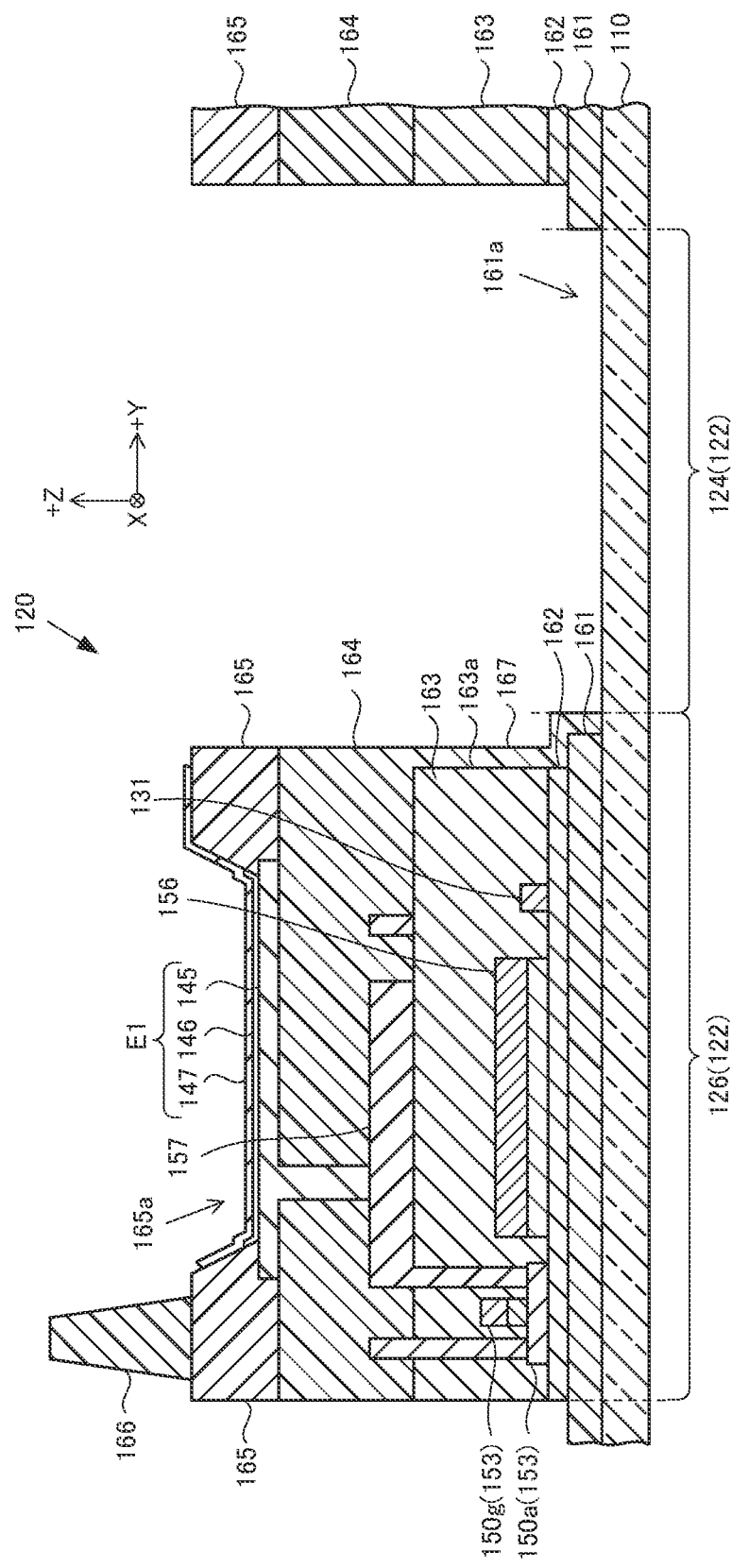
FIG. 16 is a cross-sectional view illustrating a display region according to a modified example.
Figure 17:
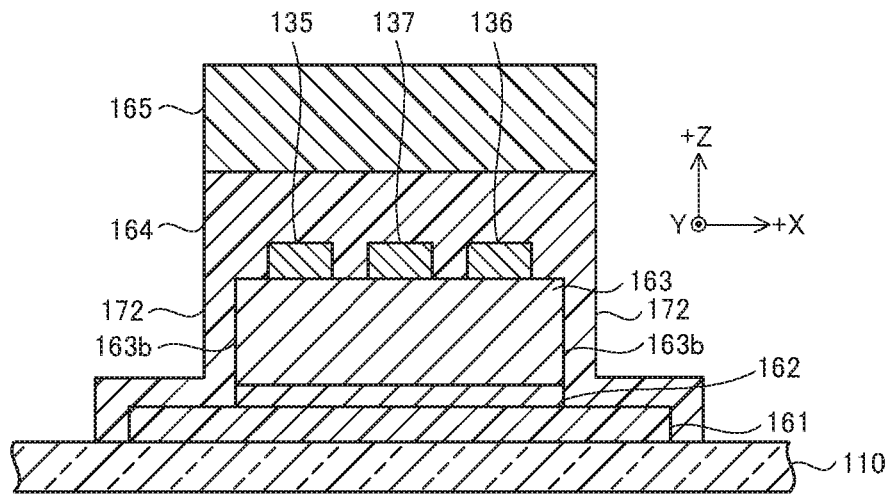
FIG. 17 is a cross-sectional view illustrating a second light blocking wall according to a modified example.

In Embodiments 1 and 2, the first light blocking wall 167 is provided on the first light blocking layer 161, and the first light blocking wall 167 is connected to the first light blocking layer 161. In a case in which the first light blocking layer 161 is formed from a metal, it is preferable that the first light blocking wall 167 covers the end portion of the first light blocking layer 161 as illustrated in FIG. 16 in order to prevent reflecting of the external light by the end portion of the first light blocking layer 161. Additionally, it is preferable that the second light blocking wall 172 covers the end portion of the first light blocking layer 161 as illustrated in FIG. 17. Furthermore, the third light blocking wall 173 may cover the end portion of the first light blocking layer 161.

In Embodiment 5, a configuration in which the second insulating layer 164 and the defining layer 165 are caused to function light blocking layers by forming the second insulating layer 164 and the defining layer 165 from a photosensitive resin that includes a black pigment may be provided. In this case, reflecting of the external light by the electrodes 156, 157, the anode electrode 145, the supply wirings 135, 136, 137, the wirings, and the like can be suppressed even more.

Figure 18:
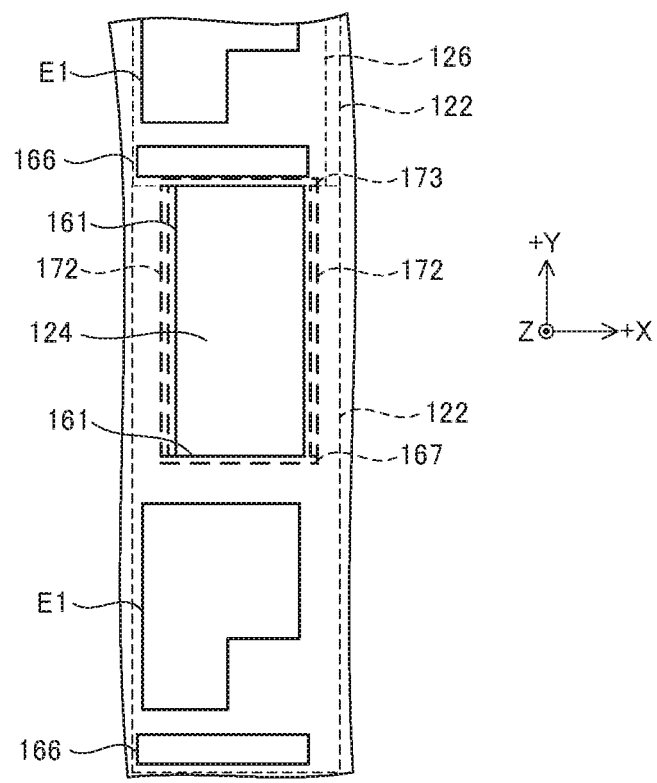
FIG. 18 is a plan view illustrating a display region according to a modified example.

A configuration in which the display device 10 of Embodiment 2 includes the second light blocking wall 172 and the third light blocking wall 173 may be provided. In this case, the first light blocking wall 167, the second light blocking wall 172, the third light blocking wall 173, and the second insulating layer (the second light blocking layer) 164 may be integrally formed. Furthermore, as illustrated in FIG. 18, a configuration in which the light transmitting region 124 is surrounded by the first light blocking wall 167 and the second light blocking wall 172, and also the third light blocking wall 173 of the adjacent pixel 122 may be provided.

A configuration in which the display device 10 of Embodiment 1 includes the second light blocking wall 172, the third light blocking wall 173, and the fifth light blocking wall 176 may be provided. In this case, the second light blocking wall 172, the third light blocking wall 173, the fifth light blocking wall 176, and the defining layer (the second light blocking layer) 165 may be integrally formed.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2019-136128, filed on Jul. 24, 2019 and Japanese Patent Application No. 2020-66024, filed on Apr. 1, 2020, the entire disclosure of which is incorporated by reference herein.

What is claimed is:

1. A display device, comprising:
   a light transmitting substrate in which pixels are arranged, each of the pixels having a light transmitting region that transmits external light and a light emitting region in which a light emitting element is disposed;
   a first light blocking layer that is disposed in the light emitting region and blocks the external light;
   a thin film transistor that is positioned above the first light blocking layer, is arranged on a side opposite to the light transmitting substrate of the first light blocking layer, and controls a light emission of the light emitting element;
   a first insulating layer that covers an active layer of the thin film transistor;
   a second light blocking layer that is positioned above the first insulating layer, and is arranged on a side opposite to the light transmitting substrate of the first insulating layer so as to cover the thin film transistor and blocks the external light; and
   a first light blocking wall that extends from the second light blocking layer towards the light transmitting substrate to directly connect the first light blocking layer and the second light blocking layer and block the external light.

2. The display device according to claim 1, wherein the first light blocking wall covers a side surface of the first insulating layer positioned on a side of the light transmitting region in the pixel.

3. The display device according to claim 2, wherein:
   the light transmitting substrate includes wiring connected to a drain or a source of the thin film transistor;
   the wiring is disposed on the first insulating layer that is disposed on the first light blocking layer; and
   the second light blocking layer covers the wiring.

4. The display device according to claim 3, further comprising:
   a second light blocking wall that is connected to the first light blocking layer and the second light blocking layer, covers a side surface of the first insulating layer on which the wiring is disposed, and blocks the external light.

5. The display device according to claim 4, wherein the second light blocking layer and the second light blocking wall are integrally formed.

6. The display device according to claim 4, further comprising:
   a third light blocking wall that is connected to the first light blocking layer and the second light blocking layer, covers a side surface of the first insulating layer opposite to the first light blocking wall, and blocks the external light,
   wherein the light transmitting region of the pixel is surrounded by the first light blocking wall and the second light blocking wall in the pixel, and surrounded by the third light blocking wall in a pixel adjacent to the pixel.

7. The display device according to claim 2, further comprising:
   a third light blocking wall that is connected to the first light blocking layer and the second light blocking layer, covers a side surface of the first insulating layer opposite to the first light blocking wall, and blocks the external light.

8. The display device according to claim 7, wherein the second light blocking layer and the third light blocking wall are integrally formed.

9. The display device according to claim 2, wherein:
   the first light blocking layer includes a metal, and
   the first light blocking wall covers an end portion of the first light blocking layer.

10. The display device according to claim 2, wherein the second light blocking layer includes at least one of (i) a second insulating layer that is disposed on the first insulating layer or (ii) a defining layer that is disposed on the second insulating layer and includes an opening in which a light emitting layer of the light emitting element is provided.

11. The display device according to claim 1, wherein the first light blocking wall penetrates the first insulating layer in the light emitting region.

12. The display device according to claim 11, further comprising:
   a fourth light blocking layer that is connected to the first light blocking wall, and surrounds the active layer of the thin film transistor together with the first light blocking wall.

13. The display device according to claim 1, wherein the second light blocking layer and the first light blocking wall are integrally formed.

14. The display device according to claim 1, further comprising:
   a driver circuit that is disposed around a display region of the light transmitting substrate on which the pixels are arranged and drives the thin film transistor; and
   a fifth light blocking wall that is disposed on the light transmitting substrate, surrounds the display region and the driver circuit, and blocks the external light.

* * * * *